US012706610B2

(12) United States Patent
Su et al.

(10) Patent No.: US 12,706,610 B2
(45) Date of Patent: Aug. 11, 2026

(54) FRACTIONAL FREQUENCY-DIVIDER CIRCUIT

(71) Applicant: Apple Inc., Cupertino, CA (US)

(72) Inventors: Richard Y. Su, Santa Clara, CA (US); Boon-Aik Ang, Los Altos, CA (US); Dennis M. Fischette, Jr., Mountain View, CA (US); Samed Maltabas, Santa Clara, CA (US); Shaobo Liu, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/733,435

(22) Filed: Jun. 4, 2024

(65) Prior Publication Data

US 2025/0373255 A1 Dec. 4, 2025

(51) Int. Cl.
*H03L 7/081* (2006.01)
*H03L 7/089* (2006.01)
*H03L 7/197* (2006.01)

(52) U.S. Cl.
CPC .......... *H03L 7/1974* (2013.01); *H03L 7/0812* (2013.01); *H03L 7/0814* (2013.01); *H03L 7/0891* (2013.01)

(58) Field of Classification Search
CPC ...... H03K 21/00; H03K 21/02; H03K 21/026; H03K 21/08; H03K 21/10; H03L 7/081; H03L 7/0812; H03L 7/0814; H03L 7/0996; H03L 7/18; H03L 7/183; H03L 7/191; H03L 7/197; H03L 7/1974; H03L 7/1976
USPC .................................................. 327/115, 117
See application file for complete search history.

(56) References Cited

U.S. PATENT DOCUMENTS 5,394,116 A * 2/1995 Kasturia ................ H03B 27/00 331/34
5,448,191 A * 9/1995 Meyer ..................... H03L 7/081 327/107
5,889,436 A * 3/1999 Yeung ................... H03L 7/0996 331/25

(Continued)

FOREIGN PATENT DOCUMENTS

CN 101527564 A 9/2009
CN 105915216 A 8/2016

(Continued)

OTHER PUBLICATIONS

Guo et al., "A DLL-based Period Synthesis", Proceeding of the IEEE 28th Canadian Conference on Electrical and Computer Engineering, May 3-6, 2015, 4 pages.

(Continued)

*Primary Examiner* — Levi Gannon
(74) *Attorney, Agent, or Firm* — DICKINSON WRIGHT RLLP

(57) ABSTRACT

A fractional frequency-divider circuit is disclosed. The fractional frequency-divider circuit includes a phase generation circuit that receives an input clock signal that has a first frequency, and generates multiple phase signals using the input clock signal. The fractional frequency-divider circuit also includes a phase selection circuit that selects different ones of the multiple phase signals at different times to generate an output clock signal with a second frequency such that a ratio of the first frequency to the second frequency is a non-integer value.

14 Claims, 12 Drawing Sheets

(56) References Cited

U.S. PATENT DOCUMENTS 5,970,110 A * 10/1999 Li ........................ H03L 7/0995 327/236
6,542,013 B1 4/2003 Volk et al.
7,675,332 B1 3/2010 Kwasniewski et al.
9,013,213 B2 4/2015 Chandrashekar et al.
10,110,238 B2 10/2018 Ek et al.
2001/0030565 A1* 10/2001 Ebuchi .................. H03L 7/0996 327/156
2003/0198311 A1* 10/2003 Song ..................... H03L 7/1978 375/376
2005/0168290 A1* 8/2005 Parikh ................... H03L 7/0996 331/16
2005/0280473 A1* 12/2005 Puma ................... H03C 3/0925 331/16
2006/0220697 A1 10/2006 Flynn
2008/0164917 A1* 7/2008 Floyd .................... H03L 7/1974 375/376
2011/0018594 A1* 1/2011 Saverio ................ H03K 3/3562 327/118
2011/0286510 A1* 11/2011 Levantino ............. H03B 27/00 327/156
2018/0138934 A1* 5/2018 Bhatta .................. H03K 5/1252
2019/0068205 A1* 2/2019 Tamura ................. H03L 7/0995
2020/0266806 A1* 8/2020 Nakajima ............... H03L 7/093

FOREIGN PATENT DOCUMENTS

CN 113872596 A 12/2021
EP 4203322 A1 6/2023
KR 1851215 B1 4/2018

OTHER PUBLICATIONS

Gholami et al., "A DLL-based frequency synthesizer for VHF DVB-H/T receivers", Symbolic and Numerical Methods, Modeling and Applications to Circuit Design (SM2ACD), 2010 XITH International Workshop on, IEEE, Piscataway, NJ, USA, Oct. 4, 2010, pp. 1-5.
International Patent Application No. PCT/US2025/021158—International Search Report and Written Opinion dated Jul. 15, 2025.

* cited by examiner

FRACTIONAL FREQUENCY-DIVIDER CIRCUIT

FIELD

The described embodiments relate generally to computer systems and, more particularly, to techniques for dividing the frequency of clock signals to generate different clock signals.

BACKGROUND

Modern computer systems may include multiple circuit blocks designed to perform various functions. For example, such circuit blocks may include processors or processor cores configured to execute software or program instructions. Additionally, the circuit blocks may include memory circuits, mixed-signal circuits, analog circuits, and the like.

Some computer systems include circuit blocks that include digital circuits that operate using a periodic digital signal referred to as a "clock signal." Various circuits may be used to generate clock signals in a computer system. For example, in some computer systems, a crystal oscillator circuit or an inductor-capacitor oscillator circuit (referred to as an "LC oscillator circuit") may be used to generate a clock signal that has a particular frequency. Clock signals of other frequencies can be generated using phase-locked loop circuits, delay-locked loop circuits, or frequency-divider circuits.

DETAILED DESCRIPTION

Figure 1:
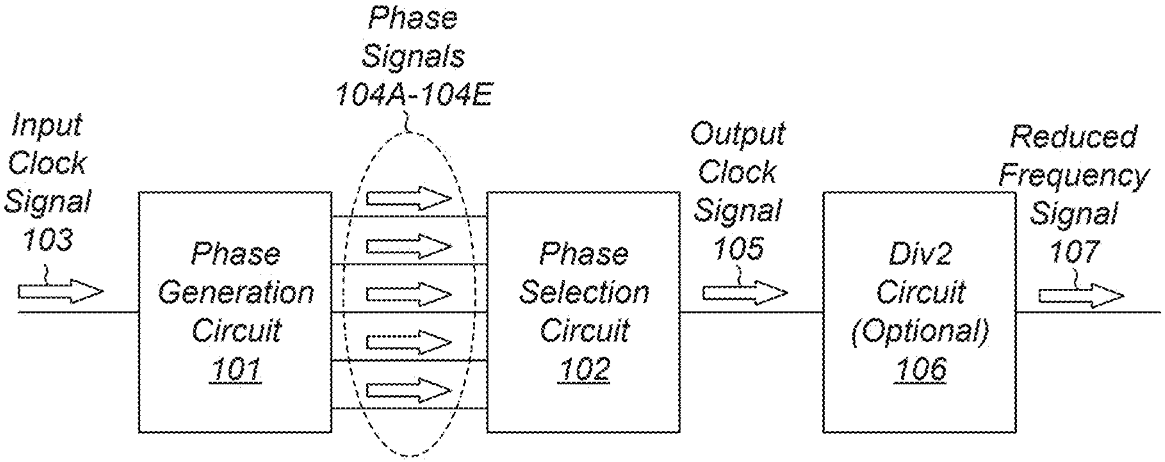
FIG. 1 is a block diagram depicting an embodiment of a fractional frequency-divider circuit.

Computer systems may include multiple circuit blocks configured to use periodic signals, referred to as clock signals, to perform various operations. For example, in some computer systems, one or more clock signals may be used to send data from one device to another within the computer system. In such cases, the one or more clock signals may be transmitted along with the data, and the receiving device may use the one or more clock signals to sample the received data.

A variety of techniques may be employed to generate the various clock signals a computer system may employ. In some cases, a crystal-oscillator circuit or an inductor-capacitor oscillator circuit (referred to as an "LC oscillator circuit") may be used to generate a base clock signal that can be used in the generation of other clock signals of various frequencies.

In some cases, the frequencies of clock signals generated from the base clock signal may be integer factors of the frequency of the base clock signal. That is, a ratio of the frequency of the base clock signal to a frequency of one of the generated clock signals is a positive integer value.

To generate clock signals whose frequencies are integer factors of the frequency of the base clock signal, an integer-divider circuit may be employed. An integer-divider circuit may employ multiple flip-flop circuits that can be configured to toggle their respective outputs in response to the detection of an integer number of transitions of the base clock signal.

In some applications, e.g., serialization/deserialization ("SERDES") applications, clock signals may be employed whose frequencies are non-integer factors of the frequency of the base clock signal. Many computer systems employ a phase-locked loop circuit to generate a clock signal whose frequency is a non-integer factor of the base clock signal. In some communication applications, multiple clock signals may be used to simultaneously support multiple frequency bands of corresponding communication protocols. To generate such multiple clock signals, multiple phase-locked loop circuits may be employed.

A phase-locked loop circuit can include an oscillator circuit, along with a phase or frequency detector circuit, and a filter circuit. The oscillator circuit may be implemented as a ring-oscillator circuit or an LC oscillator circuit, both of which may use an undesirable amount of area on an integrated circuit. Such phase-locked loop circuits may also consume an undesirable amount of power. As process technology has evolved, the cost per-unit-area of silicon has increased, making smaller circuit solutions for clock generation desirable.

The embodiments illustrated in the drawings and described below provide techniques for generating clock signals using a fractional frequency-divider circuit. As used herein, a fractional frequency-divider circuit is a frequency-divider circuit that generates a reduced-frequency version of an input signal, where the reduced frequency is a non-integer factor of the input signal. An output clock signal may be generated by generating multiple phase signals using a base clock signal and selecting different phase signals at different times to form the output clock signal that has a frequency that is a non-integer factor of a frequency of the base clock signal. By employing phase generation and selection circuits, the use of phase-locked loop circuits can be avoided, thereby saving silicon area and power.

A block diagram of an embodiment of a fractional frequency-divider circuit is depicted in FIG. 1. As illustrated, fractional frequency-divider circuit 100 includes phase generation circuit 101 and phase selection circuit 102. In various embodiments, fractional frequency-divider circuit 100 may optionally include div2 circuit 106.

Phase generation circuit 101 is configured to receive input clock signal 103 with a first frequency. For example, in some embodiments, the frequency of input clock signal 103 may be 8 GHz. In various embodiments, phase generation circuit

101 is further configured to generate phase signals 104A-104E using input clock signal 103. As described below, phase signals 104A-104E may have a frequency less than the frequency of input clock signal 103. For example, in the case where the frequency of input clock signal 103 is 8 GHz, the respective frequencies of phase signals 104A-104E may be 2 GHz. In various embodiments, phase signals 104A-104E are equally spaced in phase space such that a phase difference between a particular pair of adjacent phase signals is the same as a phase difference between a different pair of adjacent phase signals.

Phase selection circuit 102 is configured to select different phase signals of phase signals 104A-104E at corresponding times to generate output clock signal 105. In various embodiments, a ratio of the frequency of input clock signal 103 to the frequency of output clock signal 105 is a non-integer value. For example, in some cases the frequency of input clock signal 103 can be 8 GHz and the frequency of output clock signal 105 is 5 GHz, resulting in a ratio of 1.6.

In some embodiments, fractional frequency-divider circuit 100 may optionally include div2 circuit 106 which is configured to perform an additional integer frequency division. For example, in some cases the 5 GHz output clock signal 105 may be divided by 2, resulting in a frequency of 2.5 GHz for reduced frequency signal 107. In various embodiments, div2 circuit 106 may be implemented using a flip-flop circuit, or any other circuit configured to generate an output signal that has a frequency half that of its input signal.

Figure 2:
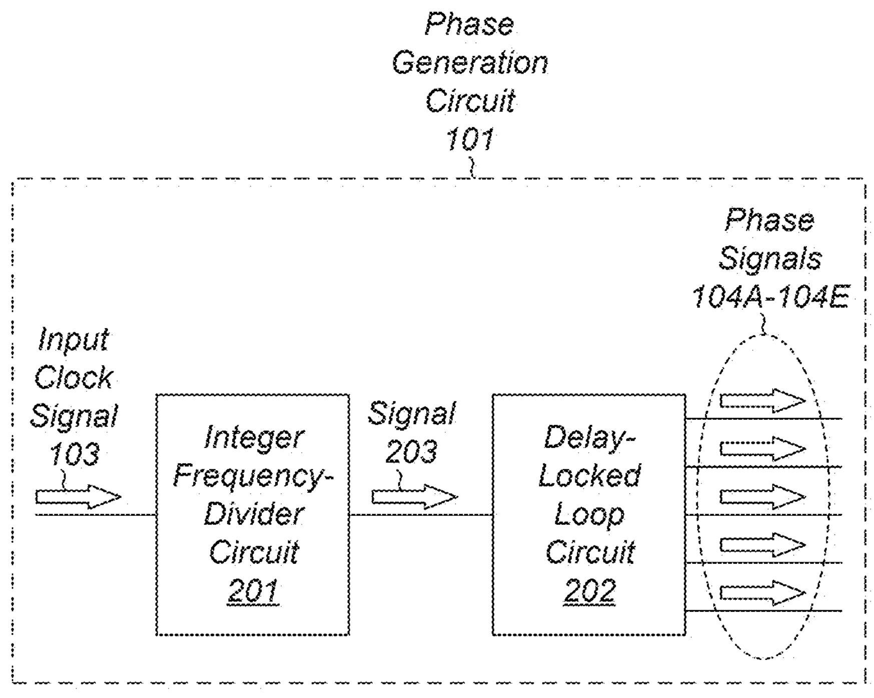
FIG. 2 is a block diagram depicting an embodiment of a phase-generation circuit for a fractional frequency-divider circuit.

Turning to FIG. 2, a block diagram of an embodiment of phase generation circuit 101 is depicted. As illustrated, phase generation circuit 101 includes integer frequency-divider circuit 201 and delay-locked loop circuit 202. It is noted that, in some embodiments, integer frequency—divider circuit 201 may be omitted and input clock signal 103 may be coupled to delay-locked loop circuit 202.

Integer frequency-divider circuit 201 is configured to generate signal 203 using input clock signal 103. In various embodiments, integer frequency-divider circuit 201 is configured to generate signal 203 such that a frequency of signal 203 is an integer factor of the frequency of input clock signal 103. In other words, a ratio of the frequency of input clock signal 103 to the frequency of signal 203 is an integer value. For example, in some embodiments, the frequency of input clock signal 103 may be 8 GHz and the frequency of signal 203 may be 2 GHz. In various embodiments, integer frequency-divider circuit 201 is employed to provide a signal of lower frequency to delay-locked loop circuit 202 and circuits in phase selection circuit 102 to relax timing requirements and reduce power consumption.

Delay-locked loop circuit 202 is configured to generate phase signals 104A-104E using signal 203 (or input clock signal 103 in embodiments where integer frequency-divider circuit 201 is omitted). As described below, delay-locked loop circuit 202 may be configured to generate phase signals 104A-104E by delaying signal 203 by corresponding delay or time periods. In various embodiments, the corresponding delay periods are the same such that phase signals 104A-104E are equally spaced in phase space. Although delay-locked loop circuit 202 is depicted as generating five phase signals, in other embodiments, delay-locked loop circuit 202 may be configured to generate any suitable number of phase signals.

Figure 3:
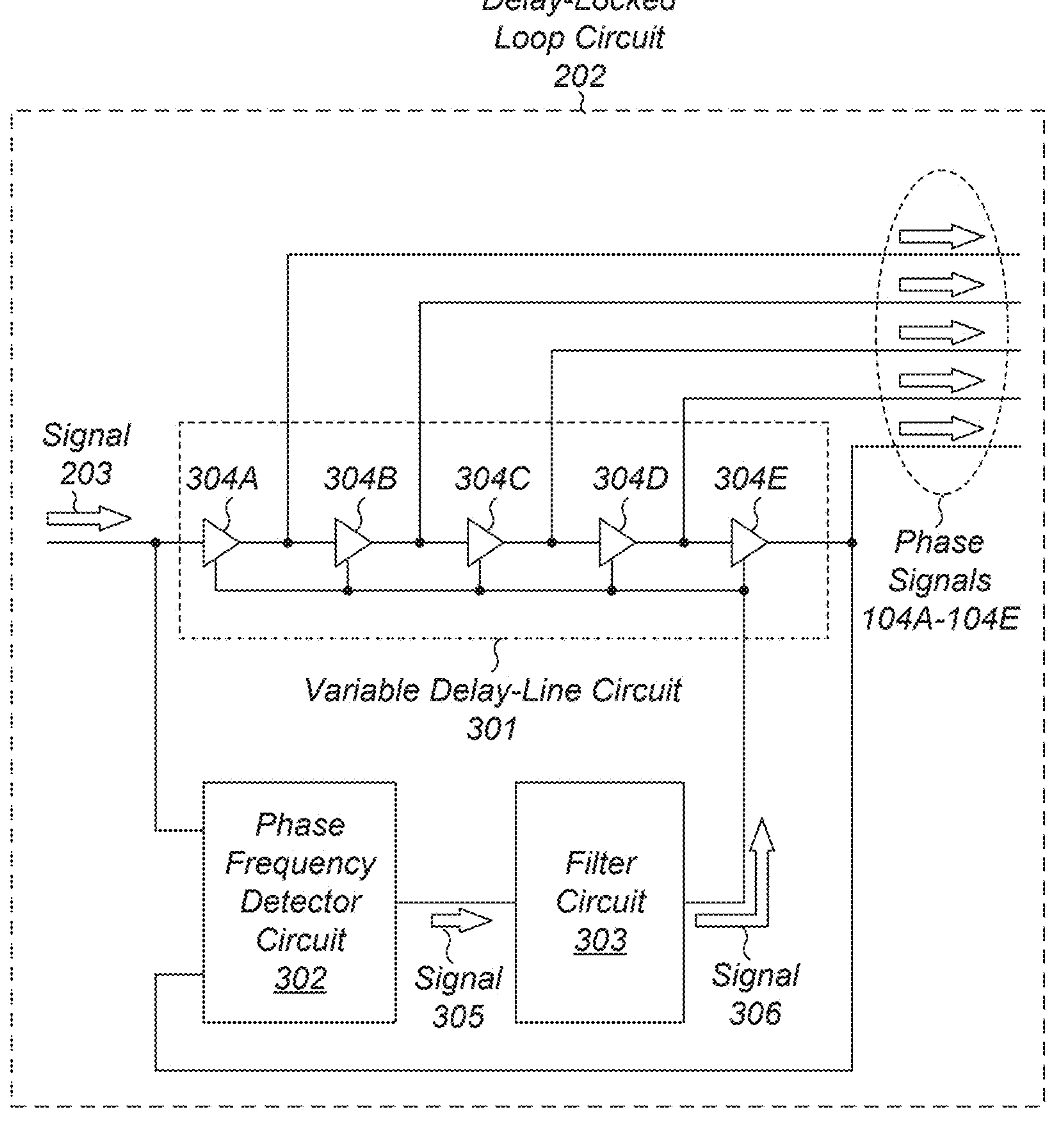
FIG. 3 is a block diagram depicting an embodiment of a delay-locked loop circuit for a phase-generation circuit.

Turning to FIG. 3, a block diagram of an embodiment of delay-locked loop circuit 202 is depicted. As illustrated, delay-locked loop circuit 202 includes variable delay-line circuit 301, phase frequency detector circuit 302, and filter circuit 303. Variable delay-line circuit 301 includes delay elements 304A-304E.

Delay element 304A is configured to generate phase signal 104A by delaying signal 203, while delay element 304B is configured to generate phase signal 104B by delaying phase signal 104A. In a similar fashion, delay element 304C is configured to generate phase signal 104C by delaying phase signal 104B, and delay element 304D is configured to generate phase signal 104D by delaying phase signal 104C. Delay element 304E is configured to generate phase signal 104E by delaying phase signal 104D.

Filter circuit 303 is configured to attenuate high-frequency components included in signal 305 to generate signal 306. In various embodiments, filter circuit 303 may be implemented as a low-pass filter circuit that includes one or more capacitors. In some embodiments, the values of such capacitors may be selected based on the desired bandwidth of delay-locked loop circuit 202.

Delay elements 304A-304E are configured to adjust their respective delay values based on signal 306 generated by filter circuit 303. In various embodiments, signal 306 may adjust a power supply voltage level for delay elements 304A-304E thereby increasing or decreasing the delay through each of delay elements 304A-304E. In some cases, filter circuit 303 may include an analog-to-digital converter circuit and signal 306 may be a digital signal. In such cases, different bits of signal 306 may open or close switches included in delay elements 304A-304E to increase or decrease the effective sizes of transistors included in delay elements 304A-304E.

Phase frequency detector circuit 302 is configured to generate signal 305 based on a phase difference between signal 203 and phase signal 104E. In various embodiments, phase frequency detector circuit 302 may be configured to increase a value of signal 305 in response to a determination that phase signal 104E leads signal 203. Alternatively, phase frequency detector circuit 302 may be configured to decrease a value of signal 305 in response to a determination that phase signal 104E lags signal 203. It is noted that, in different embodiments, phase frequency detector circuit 302 may cause signal 305 to behave differently based on the phase difference between phase signal 104E and signal 203.

Figure 4:
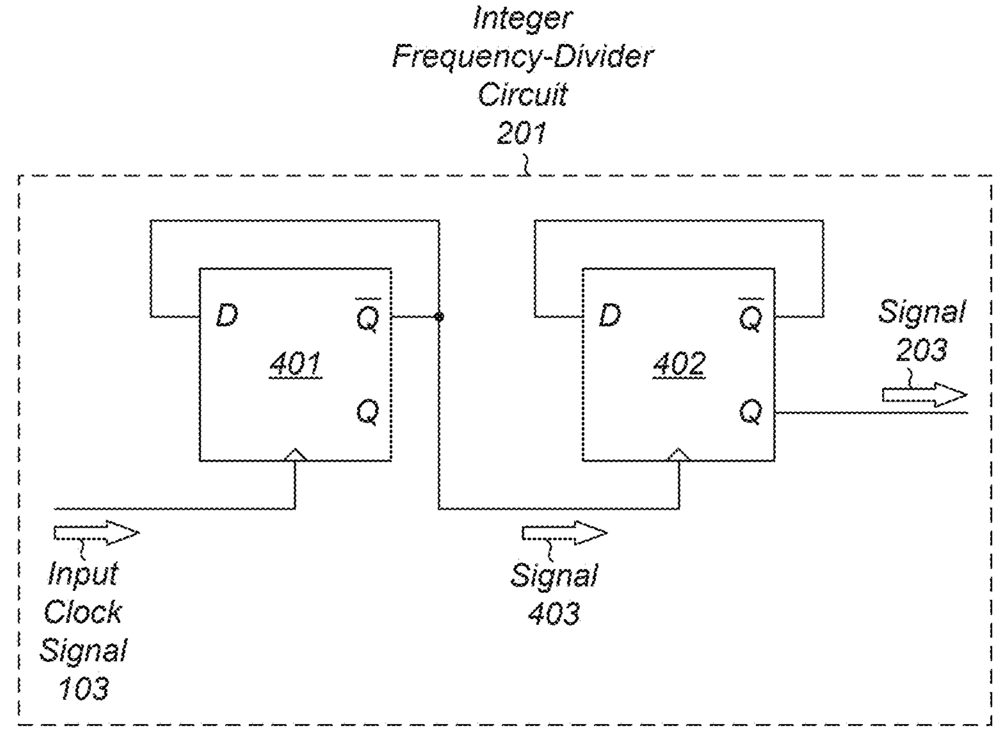
FIG. 4 is a block diagram depicting an embodiment of an integer frequency-divider circuit.

Turning to FIG. 4, a block diagram of an embodiment of an integer frequency-divider circuit 201 is depicted. As illustrated, integer frequency-divider circuit 201 includes flip-flop circuits 401 and 402.

The clock input of flip-flop circuit 401 is coupled to input clock signal 103, while the D input of flip-flop circuit 401 is coupled to the Q-bar output of flip-flop circuit 401. With the D input coupled to the Q-bar output, flip-flop circuit 401 is configured to toggle its Q-bar output at half the frequency of input clock signal 103 to generate signal 403.

The clock input of flip-flop circuit 402 is coupled to signal 403. In a similar fashion to flip-flop circuit 401, the D input of flip-flop circuit 402 is coupled to the Q-bar output of flip-flop circuit 402. With the D input coupled to the Q-bar output, flip-flop circuit 402 is configured to toggle its Q output at half the frequency of signal 403 to generate signal 203, which is one-fourth the frequency of input clock signal 103.

In various embodiments, flip-flop circuits 401 and 402 may be implemented as D-type flip-flop circuits or any other suitable type of flip-flop circuits. Although the embodiment depicted in FIG. 4 includes only two flip-flop circuits, in other embodiments, any suitable number of flip-flop circuits may be employed to achieve a desired reduction in frequency from input clock signal 103.

Figure 5:
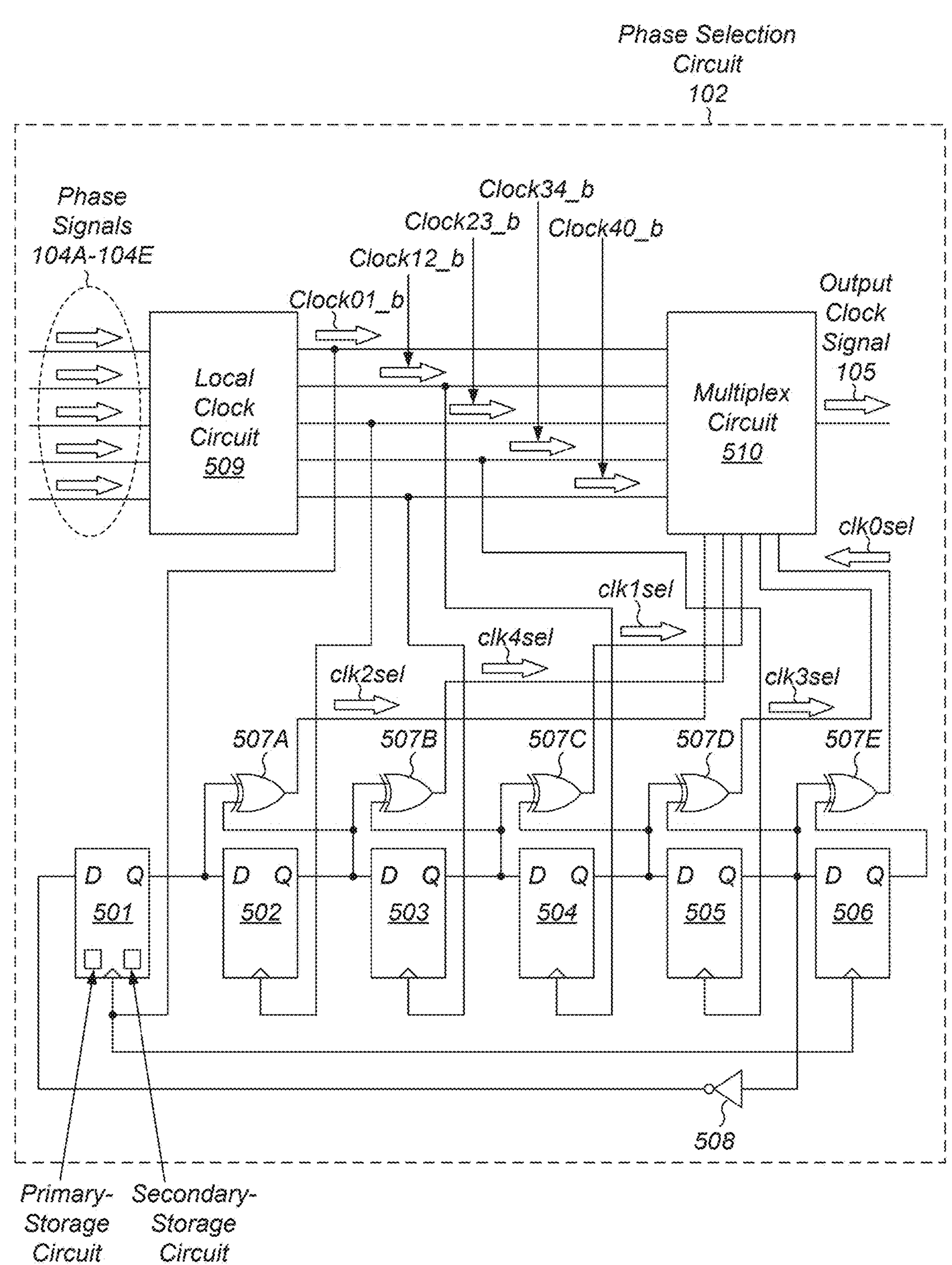
FIG. 5 is a block diagram depicting an embodiment of a phase-selection circuit.

Turning to FIG. 5, a block diagram of an embodiment of phase selection circuit 102 is depicted. As illustrated, phase selection circuit 102 includes flip-flop circuits 501-506, exclusive-OR gates 507A-507E, inverter 508, local clock circuit 509, and multiplex circuit 510.

Local clock circuit 509 is configured to generate clock01_*b*, clock12_*b*, clock23_*b*, clock34_*b*, and clock40_*b* by combining different ones of phase signals 104A-104E. It is noted that, in some embodiments, local clock circuit 509 may generate the logical inverses of clock01_*b*, clock12_*b*, clock23_*b*, clock34_*b*, and clock40_*b* as well. As described below, local clock circuit 509 may combine different ones of phase signals 104A-104E using an exclusive-OR operation. For example, to generate clock01_*b*, local clock circuit 509 may be configured to perform an exclusive-OR operation using phase signal 104A and phase signal 104B.

Flip-flop circuits 501-506 are coupled in series with the Q output of one flip-flop circuit coupled to the D input of the next flip-flop circuit in the series. The D input of flip-flop circuit 501 is coupled to the output of inverter 508, whose input is coupled to the Q output of flip-flop circuit 505. A transfer of data from primary storage circuit 511 to secondary storage circuit 512 in flip-flop circuit 501 is controlled by clock01_*b*. In a similar fashion, the transfer between primary-storage circuits and secondary-storage circuits of flip-flop circuits 502-506 are controlled by clock23_*b*, clock40_*b*, clock12_*b*, clock34_*b*, and clock01_*b*, respectively. It is noted that the primary-storage circuits and the secondary-storage circuits of flip-flop circuits 502-506 have been omitted from FIG. 5 for clarity. As each of flip-flop circuits 501-506 are clocked, corresponding ones of their respective Q outputs transition to a logical-1 value, thereby enabling corresponding ones of signals clk0sel, clk1sel, clk2sel, clk3sel, and clk4sel.

It is noted that flip-flop circuits 501-506 may be configured to reset in response to an activation of a reset signal (not shown). Additionally, flip-flop circuits 501-506 may be enabled or disabled according to an activation or deactivation of an enable signal (also not shown).

Exclusive-OR gate 507A is configured to generate clk2sel by performing an exclusive-OR operation on the respective Q outputs of flip-flop circuits 501 and 502, while exclusive-OR gate 507B is configured to generate clk4sel by performing an exclusive-OR operation on the respective Q outputs of flip-flop circuits 502 and 503. In a similar fashion, exclusive-OR gate 507C is configured to generate clk1sel by performing an exclusive-OR operation on the respective Q outputs of flip-flop circuits 503 and 504, and exclusive-OR gate 507D is configured to generate clk3sel by performing an exclusive-OR operation on the respective Q outputs of flip-flop circuits 504 and 505. Exclusive-OR gate 507E is configured to generate clk0sel by performing an exclusive-OR operation on the respective Q outputs of flip-flop circuits 505 and 506.

Multiplex circuit 510 is configured to generate output clock signal 105 by selecting a different one of clock01_*b*, clock12_*b*, clock23_*b*, clock34_*b*, and clock 40_*b* according to which of clk0sel, clk1sel, clk2sel, clk3sel, and clk4sel is active. In various embodiments, multiplex circuit 510 may be implemented using multiple pass-gate circuits coupled together in a wired-OR fashion, or any suitable combination of logic gates arranged to implement a multiplex function.

In various embodiments, flip-flop circuits 501-506 may be implemented as D-type flip-flop circuits or any other suitable type of flip-flop circuits. In some embodiments, exclusive-OR gates 507A-507E and inverter 508 may be implemented using complementary metal-oxide semiconductor ("CMOS") technology. In other embodiments, exclusive-OR gates 507A-507E and inverter 508 may be implemented using technology other than CMOS.

Figure 6:
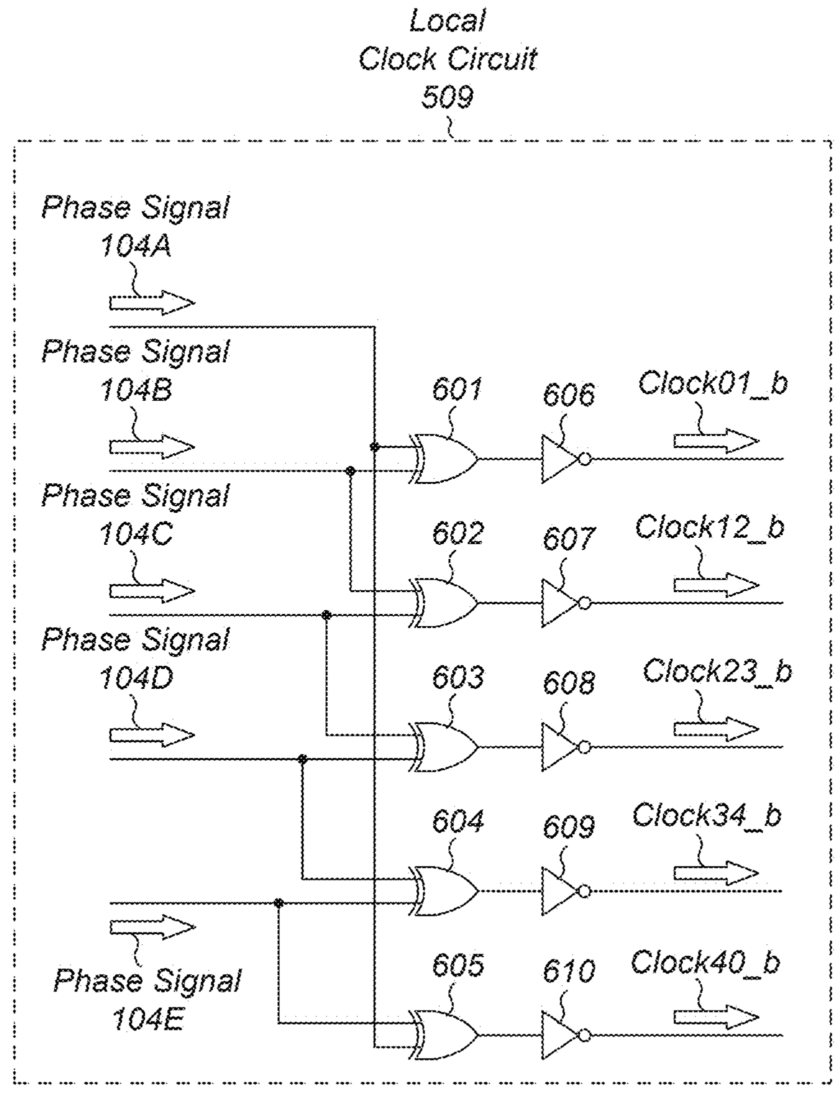
FIG. 6 is a block diagram depicting an embodiment of a local clock-generation circuit for a phase-selection circuit.

Turning to FIG. 6, a block diagram of an embodiment of local clock circuit 509 is depicted. As illustrated, local clock circuit 509 includes exclusive-OR gates 601-605 and inverters 606-610. It is noted that the respective numbers of exclusive-OR gates and inverters is a function of the number of phase signals generated by phase generation circuit 101. In other embodiments, where phase generation circuit 101 generates more or less phase signals, the number of exclusive-OR gates and inverters in local clock circuit 509 can be adjusted accordingly.

Exclusive-OR gate 601 is configured to combine phase signal 104A and phase signal 104B by performing an exclusive-OR operation. Inverter 606 is configured to invert the logical sense of the output of exclusive-OR gate 601 to generate clock01_*b*.

Exclusive-OR gate 602 is configured to combine phase signal 104B and phase signal 104C by performing an exclusive-OR operation. Inverter 607 is configured to invert the logical sense of the output of exclusive-OR gate 602 to generate clock12_*b*.

Exclusive-OR gate 603 is configured to combine phase signal 104C and phase signal 104D by performing an exclusive-OR operation. Inverter 608 is configured to invert the logical sense of the output of exclusive-OR gate 603 to generate clock23_*b*.

Exclusive-OR gate 604 is configured to combine phase signal 104D and phase signal 104E by performing an exclusive-OR operation. Inverter 609 is configured to invert the logical sense of the output of exclusive-OR gate 604 to generate clock34_*b*.

Exclusive-OR gate 605 is configured to combine phase signal 104E and phase signal 104A by performing an exclusive-OR operation. Inverter 610 is configured to invert the logical sense of the output of exclusive-OR gate 605 to generate clock40_*b*.

In various embodiments, exclusive-OR gates 601-605 and inverters 606-610 may be implemented using CMOS technology. In other embodiments, exclusive-OR gates 601-605 and inverters 606-610 may be implemented using technology other than CMOS.

Figure 7:
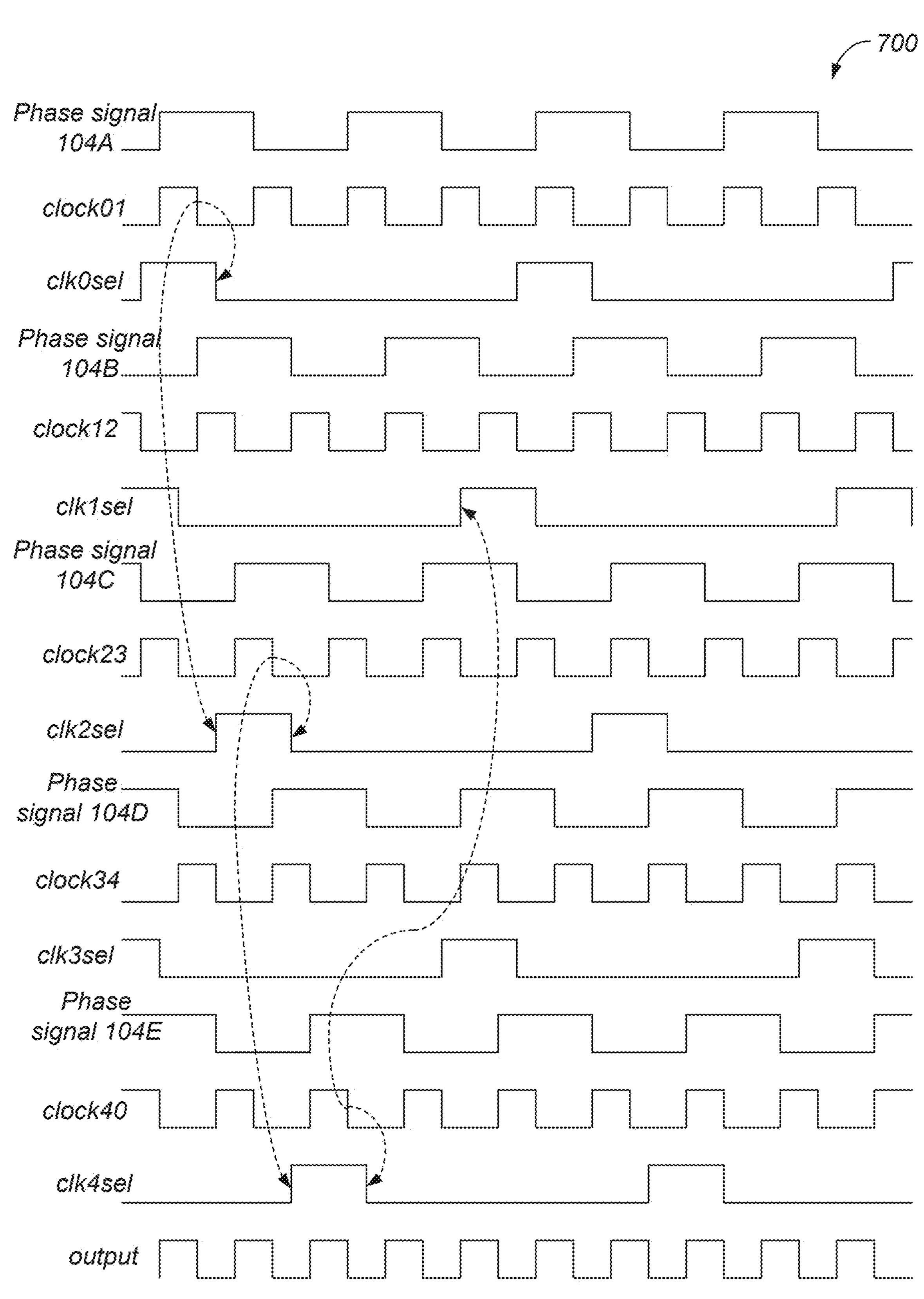
FIG. 7 is a diagram of waveforms associated with the operation of a fractional frequency-divider circuit.

Turning to FIG. 7, waveforms associated with the operation of a fractional frequency-divider circuit are depicted. The names of the various waveforms correspond to the names of the signals in the previously described figures.

As illustrated, when flip-flop circuit 501 is storing a logical-1 value, a falling edge of clock01 triggers a falling edge of clk0sel as well as a rising edge of clk2sel as the logical-1 stored by flip-flop circuit 501 is clocked into flip-flop circuit 502. In a similar fashion, when flip-flop circuit 502 is storing a logical-1 value, a falling edge of clock23 triggers a falling edge of clock2sel as well as a rising edge of clk4sel and a rising edge of clk4sel when flip-flop circuit 506 is storing a logical-1. When clk4sel is a logical-1, a falling edge of clock40 triggers a falling edge of clk4sel. Additionally, the falling edge of clock40 can trigger a rising edge of clk1sel when flip-flop circuit 503 stores a logical-1.

It is noted that the relationship between other edges of the various signals have been omitted for clarity. It is further noted that the waveforms depicted in FIG. 7 are merely examples. In different embodiments, the relative timing between various waveforms may be different.

To summarize, various embodiments of a fractional frequency-divider circuit are disclosed. Broadly speaking, a phase generation circuit may be configured to receive an input clock with a first frequency, and generate a plurality of phase signals using the input clock signal. A phase selection circuit may be configured to select different phase signals of the plurality of phase signals at corresponding times to generate an output clock signal with a second clock frequency. A ratio of the first frequency to the second frequency can be a non-integer value.

Figure 8:
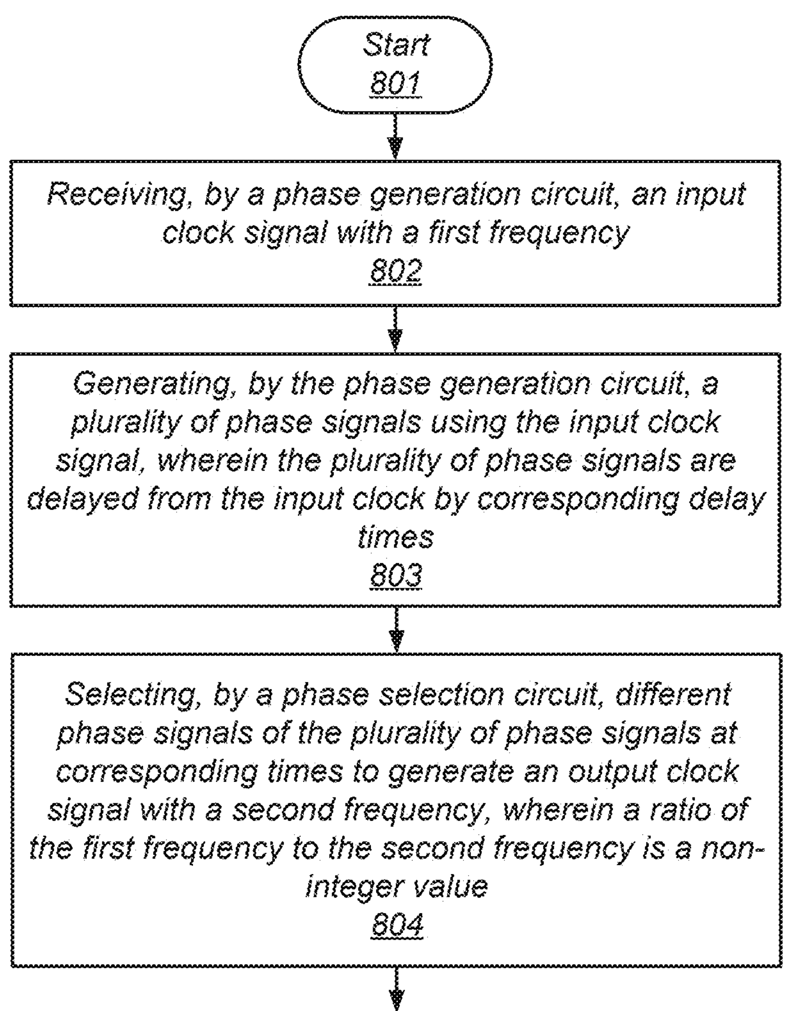
FIG. 8 is a flow diagram depicting an embodiment of a method for operating a fractional frequency-divider circuit.

Turning to FIG. 8, a flow diagram depicting an embodiment of a method for operating a fractional frequency-divider circuit is illustrated. The method, which may be applied to various fractional frequency-divider circuits, e.g., fractional frequency-divider circuit 100 as depicted in FIG. 1, begins in block 801.

The method includes receiving, by a phase generation circuit, an input clock signal with a first frequency (block 802). In various embodiments, the method may include generating, by an oscillator circuit, the input clock signal. In some cases, the oscillator circuit may include a crystal oscillator circuit.

The method further includes generating, by the phase generation circuit, a plurality of phase signals using the input clock signal (block 803). In various embodiments, the plurality of phase signals are delayed from the input clock by corresponding delay times.

In some embodiments, generating the plurality of phase signals includes generating, by a frequency divider circuit using the input clock signal, a different clock signal with a third frequency. In such cases, a second ratio of the first frequency to the third frequency may be an integer value. The method may additionally include delaying, by a delay-locked loop circuit, the different clock signal by different delay times to generate corresponding ones of the plurality of phase signals.

The method also includes selecting, by a phase selection circuit, different phase signals of the plurality of phase signals at corresponding times to generate an output clock signal with a second frequency (block 804). In various embodiments, a ratio of the first frequency to the second frequency is a non-integer value.

In some embodiments, selecting the different phase signals of the plurality of phase signals includes combining, by the phase selection circuit, pairs of the plurality of phase signals to generate corresponding ones of a plurality of local clock signals. In various embodiments, combining the pairs of the plurality of phase signals includes performing an exclusive-OR operation on a first phase signal of the plurality of phase signals and a second phase signal of the plurality of phase signals to generate a particular local clock signal of the plurality of clock signals. In other embodiments, selecting the different phase signals of the plurality of phase signals includes generating a plurality of selection signals using the local clock signals.

In various embodiments, generating the plurality of selection signals includes combining a first latched signal from a particular flip-flop circuit of a plurality of flip-flop circuits and a second latched signal from a different flip-flop circuit of the plurality of flip-flop circuits. In some embodiments, the plurality of flip-flop circuits are coupled together along with an inverter circuit to form a daisy chain. In various embodiments, a given flip-flop circuit of the plurality of flip-flop circuits includes a primary-stage circuit and a secondary-stage circuit, and is configured to transfer data from the primary-stage circuit to the secondary-stage circuit using a corresponding one of the local clock signals. In some embodiments, the different flip-flop circuit is subsequent to the particular flip-flop circuit in the daisy chain.

In some embodiments, the method further includes generating, by a frequency-divider circuit, a reduced-frequency output clock signal using the output signal. In such cases, a third frequency of the reduced-frequency output clock signal is less than the first frequency. The method concludes in block 805.

Figure 9:
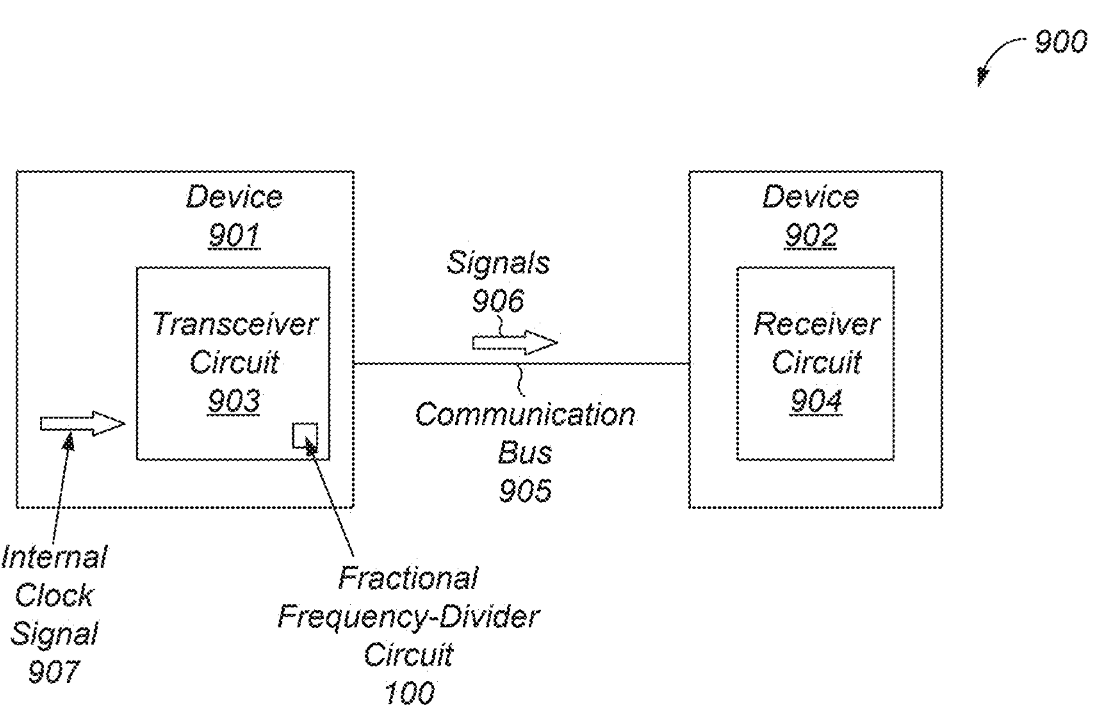
FIG. 9 is a block diagram depicting an embodiment of a computer system that transmits data between two devices.

Turning to FIG. 9, a block diagram of a computer system is depicted. As illustrated, computer system 900 includes device 901 and device 902 that are coupled together via communication bus 905. In various embodiments, communication bus 905 may employ one of various communication protocols such as Peripheral Component Interface ("PCI"), or any other suitable communication protocol.

Device 901 includes transceiver circuit 903, and device 902 includes receiver circuit 904. It is noted that both device 901 and device 902 may include numerous other circuit blocks which have been omitted from FIG. 9 for clarity.

Transceiver circuit 903 includes fractional frequency-divider circuit 100, and can be configured to transmit signals 906 to device 902 via communication bus 905. In various embodiments, signals 906 may be formatted according to a communication protocol associated with communication bus 905. Signals 906 may, in some embodiments, include one or more clock signals. For example, in some embodiments, signals 906 may include clock signals corresponding to output clock signal 105 as generated by phase selection circuit 102.

In addition to signals 906 including clock signals, signals 906 may include data packets that are transmitted in sync with the clock signals. In various embodiments, the data packets may include one or more bits. Receiver circuit 904 can be configured to sample the transmitted data using the clock signals included in signals 906. In some embodiments, receiver circuit 904 may include a clock-recovery circuit (not shown) that is configured to generate a clock signal used to sample the data packets included in signals 906, and relay the sampled data packets to other circuits included in device 902.

Figure 10:
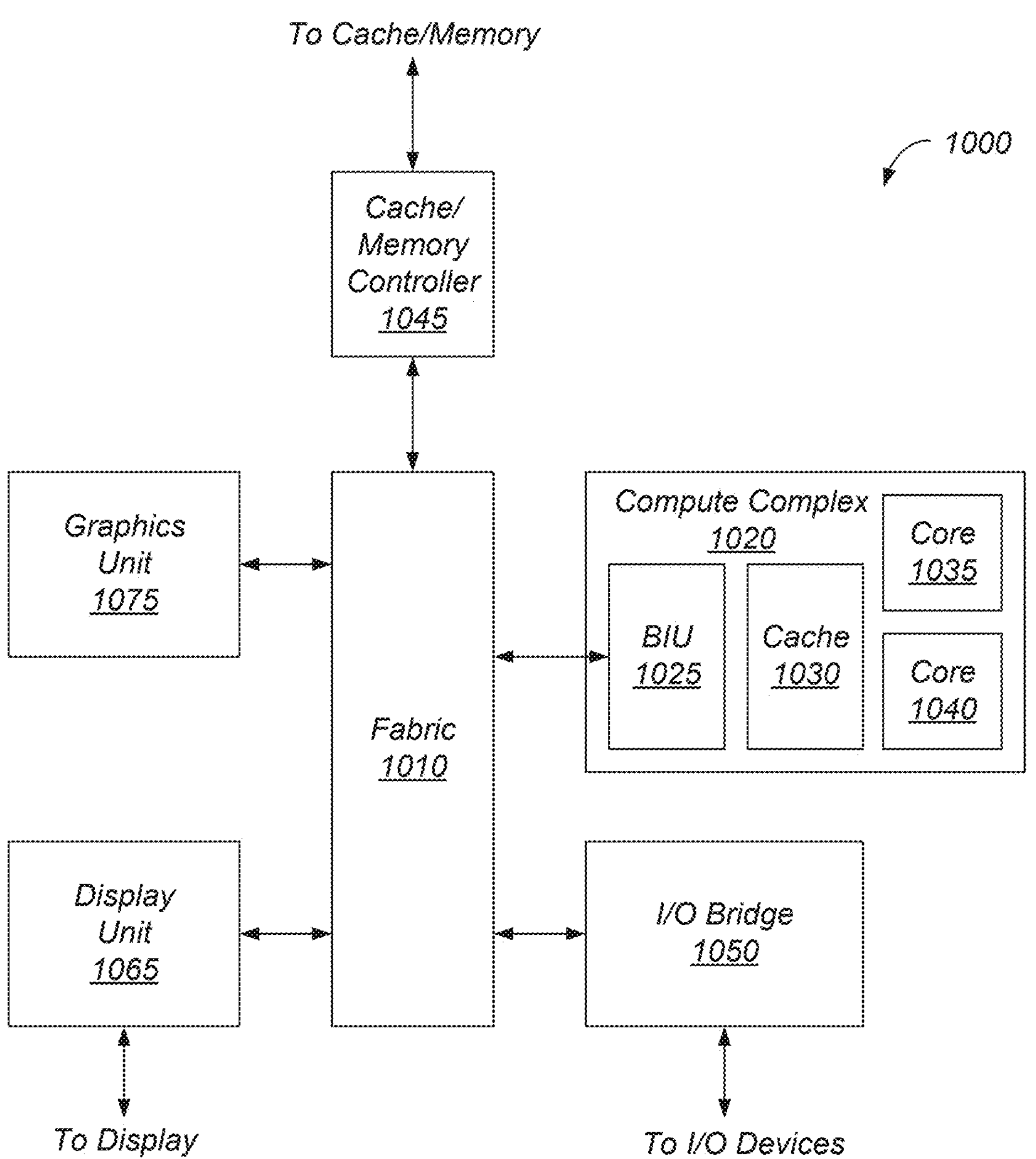
FIG. 10 is a block diagram of an embodiment of a device that includes fractional frequency-divider circuits.

Referring now to FIG. 10, a block diagram illustrating an example embodiment of a device is shown. In various embodiments, device 1000 may implement functionality of fractional frequency-divider circuit 100 as depicted in FIG. 1. In some embodiments, elements of device 1000 may be included within a system on a chip. In some embodiments, device 1000 may be included in a mobile device, which may be battery-powered. Therefore, power consumption by device 1000 may be an important design consideration. In the illustrated embodiment, device 1000 includes fabric 1010, compute complex 1020, input/output (I/O) bridge 1050, cache/memory controller 1045, graphics unit 1075, and display unit 1065. In some embodiments, device 1000 may include other components (not shown) in addition to, or in place of, the illustrated components, such as video processor encoders and decoders, image processing or recognition elements, computer vision elements, etc.

Fabric 1010 may include various interconnects, buses, MUX's, controllers, etc., and may be configured to facilitate communication between various elements of device 1000. In some embodiments, portions of fabric 1010 may be configured to implement various different communication protocols. In other embodiments, fabric 1010 may implement a single communication protocol, and elements coupled to fabric 1010 may convert from the single communication protocol to other communication protocols internally.

In the illustrated embodiment, compute complex 1020 includes bus interface unit (BIU) 1025, cache 1030, and cores 1035 and 1040. In various embodiments, compute complex 1020 may include various numbers of processors, processor cores, and caches. For example, compute complex 1020 may include 1, 2, or 4 processor cores, or any other suitable number. In one embodiment, cache 1030 is a set associative L2 cache. In some embodiments, cores 1035 and 1040 may include internal instruction and data caches. In some embodiments, a coherency unit (not shown) in fabric 1010, cache 1030, or elsewhere in device 1000, may be configured to maintain coherency between various caches of device 1000. BIU 1025 may be configured to manage communication between compute complex 1020 and other elements of device 1000. Processor cores, such as cores 1035 and 1040, may be configured to execute instructions of a particular instruction set architecture (ISA) which may include operating system instructions and user application instructions. These instructions may be stored in a computer readable medium such as a memory coupled to cache memory controller 1045 as discussed below.

As used herein, the term "coupled to" may indicate one or more connections between elements, and a coupling may include intervening elements. For example, in FIG. 10, graphics unit 1075 may be described as "coupled to" a memory through fabric 1010 and cache/memory controller 1045. In contrast, in the illustrated embodiment of FIG. 10, graphics unit 1075 is "directly coupled" to fabric 1010 because there are no intervening elements.

Cache/memory controller 1045 may be configured to manage transfer of data between fabric 1010 and one or more caches and memories. For example, cache/memory controller 1045 may be coupled to an L3 cache, which may, in turn, be coupled to a system memory. In other embodiments, cache/memory controller 1045 may be directly coupled to a memory. In some embodiments, cache/memory controller 1045 may include one or more internal caches. Memory coupled to cache/memory controller 1045 may be any type of volatile memory, such as dynamic random access memory (DRAM), synchronous DRAM (SDRAM), double data rate (DDR, DDR2, DDR3, etc.) SDRAM (including mobile versions of SDRAMs such as mDDR3, etc., and/or low power versions of SDRAMs such as LPDDR4, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with an integrated circuit in a chip-on-chip configuration, a package-on-package configuration, or a multi-chip module configuration. Memory coupled to cache/memory controller 1045 may be any type of non-volatile memory such as NAND flash memory, NOR flash memory, nano RAM (NRAM), magneto-resistive RAM (MRAM), phase change RAM (PRAM), Racetrack memory, Memristor memory, etc. As noted above, this memory may store program instructions executable by compute complex 1020 to cause the computing device to perform functionality described herein.

Graphics unit 1075 may include one or more processors, e.g., one or more graphics processing units (GPUs). Graphics unit 1075 may receive graphics-oriented instructions, such as OPENGL®, Metal®, or DIRECT3D® instructions, for example. Graphics unit 1075 may execute specialized GPU instructions or perform other operations based on the received graphics-oriented instructions. Graphics unit 1075 may generally be configured to process large blocks of data in parallel, and may build images in a frame buffer for output to a display, which may be included in the device or may be a separate device. Graphics unit 1075 may include transform, lighting, triangle, and rendering engines in one or more graphics processing pipelines. Graphics unit 1075 may output pixel information for display images. Graphics unit 1075, in various embodiments, may include programmable shader circuitry which may include highly parallel execution cores configured to execute graphics programs, which may include pixel tasks, vertex tasks, and compute tasks (which may or may not be graphics-related).

Display unit 1065 may be configured to read data from a frame buffer and provide a stream of pixel values for display. Display unit 1065 may be configured as a display pipeline in some embodiments. Additionally, display unit 1065 may be configured to blend multiple frames to produce an output frame. Further, display unit 1065 may include one or more interfaces (e.g., MIPI® or embedded display port (eDP)) for coupling to a user display (e.g., a touchscreen or an external display).

I/O bridge 1050 may include various elements, e.g., frequency divider circuit 100, configured to implement universal serial bus (USB) communications, security, audio, and low-power always-on functionality, for example. I/O bridge 1050 may also include interfaces such as pulse-width modulation (PWM), general-purpose input/output (GPIO), serial peripheral interface (SPI), and inter-integrated circuit (I2C), for example. Various types of peripherals and devices may be coupled to device 1000 via I/O bridge 1050.

In some embodiments, device 1000 includes network interface circuitry (not explicitly shown), which may be connected to fabric 1010 or I/O bridge 1050. The network interface circuitry may be configured to communicate via various networks, which may be wired, wireless, or both. For example, the network interface circuitry may be configured to communicate via a wired local area network, a wireless local area network (e.g., via Wi-Fi™), or a wide area network (e.g., the Internet or a virtual private network). In some embodiments, the network interface circuitry is configured to communicate via one or more cellular networks that use one or more radio access technologies. In some embodiments, the network interface circuitry is configured to communicate using device-to-device communications (e.g., Bluetooth® or Wi-Fi™ Direct), etc. In various embodiments, the network interface circuitry may provide device 1000 with connectivity to various types of other devices and networks.

Figure 11:
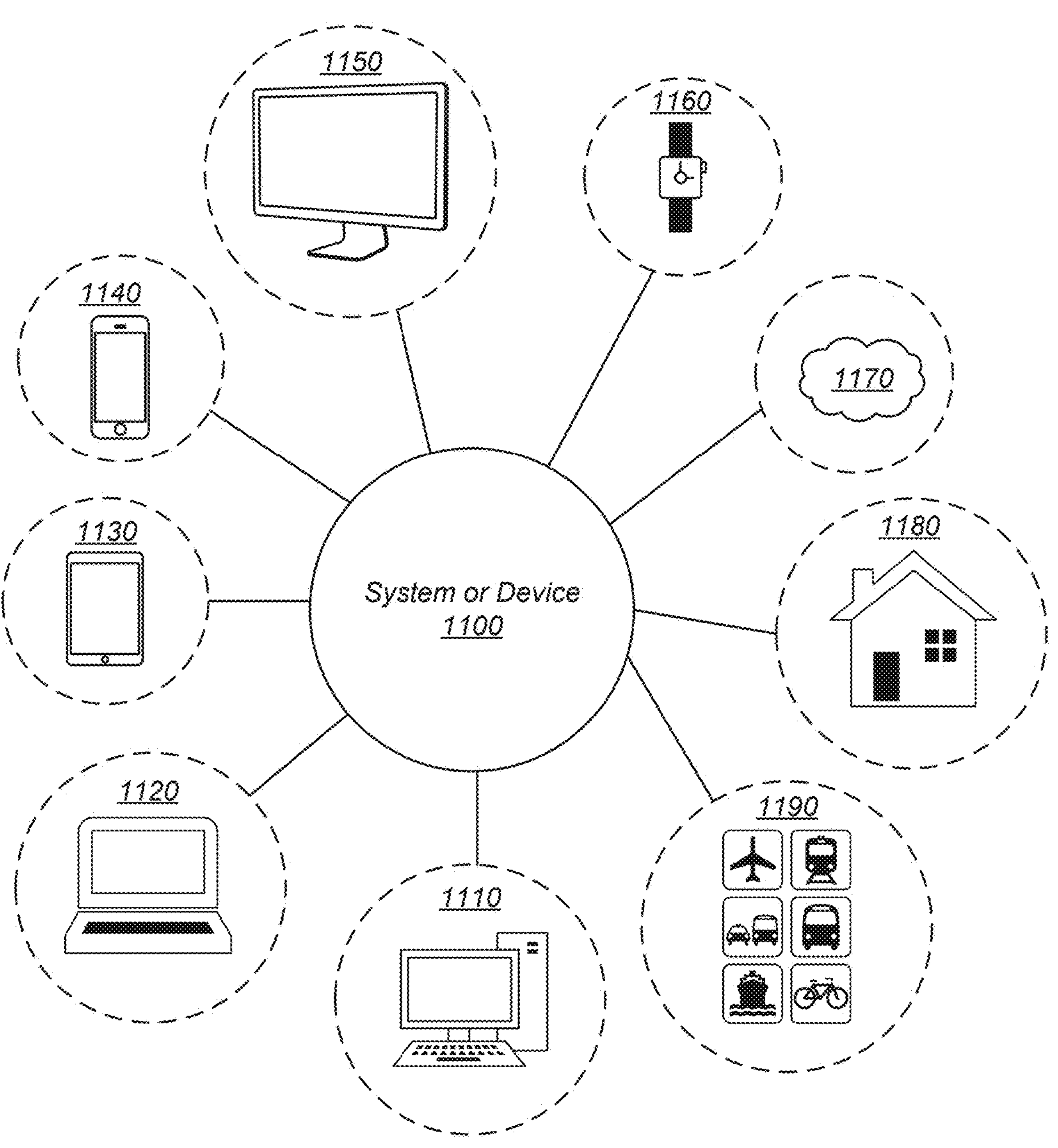
FIG. 11 is a block diagram of various embodiments of computer systems that may include fractional frequency-divider circuits.

Turning now to FIG. 11, various types of systems that may include any of the circuits, devices, or systems discussed above are illustrated. System or device 1100, which may incorporate or otherwise utilize one or more of the techniques described herein, may be utilized in a wide range of areas. For example, system or device 1100 may be utilized as part of the hardware of systems such as a desktop computer 1110, laptop computer 1120, tablet computer 1130, cellular or mobile phone 1140, or television 1150 (or set-top box coupled to a television).

Similarly, disclosed elements may be utilized in a wearable device 1160, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 1100 may also be used in various other contexts. For example, system or device 1100 may be utilized in the context of a server computer system, such as a dedicated server or on shared hardware that implements a cloud-based service 1170. Still further, system or device 1100 may be implemented in a wide range of specialized everyday devices, including devices 1180 commonly found in the home such as refrigerators, thermostats, security cameras, etc. The interconnection of such devices is often referred to as the "Internet of Things" (IoT). Elements may also be implemented in various modes of transportation. For example, system or device 1100 could be employed in the control systems, guidance systems, entertainment systems, etc. of various types of vehicles 1190.

The applications illustrated in FIG. 11 are merely exemplary and are not intended to limit the potential future applications of disclosed systems or devices. Other example applications include, without limitation: portable gaming devices, music players, data storage devices, unmanned aerial vehicles, etc.

The present disclosure has described various example circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that programs a computing system to generate a simulation model of the hardware circuit, programs a fabrication system configured to produce hardware (e.g., an integrated circuit) that includes the disclosed circuitry, etc. Claims to such a storage medium are intended to cover, for example, an entity that produces a circuit design, but does not itself perform complete operations such as design simulation, design synthesis, circuit fabrication, etc.

Figure 12:
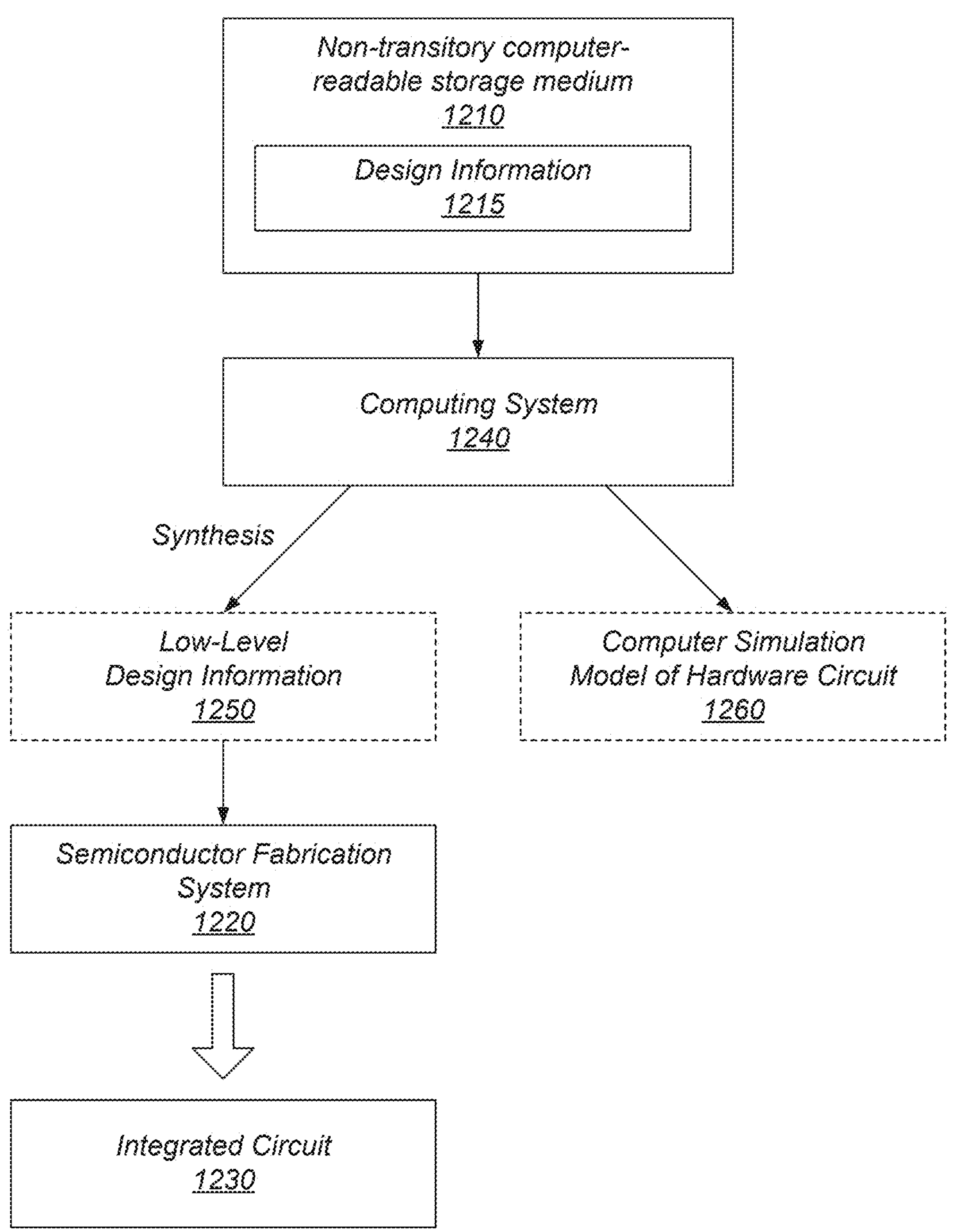
FIG. 12 illustrates an example of a non-transitory computer-readable storage medium that stores circuit design information.

FIG. 12 is a block diagram illustrating an example of a non-transitory computer-readable storage medium that stores design information 1215, according to some embodiments. In the illustrated embodiment, computing system 1240 is configured to process design information 1215. This may include executing instructions included in design information 1215, interpreting instructions included in design information 1215, compiling, transforming, or otherwise updating design information 1215, etc. Therefore, design information 1215 controls computing system 1240 (e.g., by programming computing system 1240) to perform various operations discussed below, in some embodiments.

In the illustrated example, computing system 1240 processes design information 1215 to generate both computer simulation model of hardware circuit 1260 and low-level design information 1250. In other embodiments, computing system 1240 may generate only one of these outputs, may generate other outputs based on design information 1215, or both. Regarding computer simulation model of hardware circuit 1260, computing system 1240 may execute instructions of a hardware description language that includes register transfer level (RTL) code, behavioral code, structural code, or some combination thereof. The simulation model may perform the functionality specified by design information 1215, facilitate verification of the functional correctness of the hardware design, generate power consumption estimates, generate timing estimates, etc.

In the illustrated example, computing system 1240 also processes design information 1215 to generate low-level design information 1250 (e.g., gate-level design information, a netlist, etc.). This may include synthesis operations, as shown, such as constructing a multi-level network, optimizing the network using technology-independent techniques, technology dependent techniques, or both, and outputting a network of gates (with potential constraints based on available gates in a technology library, sizing, delay, power, etc.). Based on low-level design information 1250 (potentially among other inputs), semiconductor fabrication system 1220 is configured to fabricate integrated circuit 1230 (which may correspond to functionality of the computer simulation model of hardware circuit 1260). Note that computing system 1240 may generate different simulation models based on design information at various levels of description, including low-level design information 1250, design information 1215, and so on. The data representing low-level design information 1250 and computer simulation model of hardware circuit 1260 may be stored on non-transitory computer-readable storage medium 1210, or on one or more other media.

In some embodiments, low-level design information 1250 controls (e.g., programs) semiconductor fabrication system 1220 to fabricate integrated circuit 1230. Thus, when processed by the fabrication system, the design information may program the fabrication system to fabricate a circuit that includes various circuitry disclosed herein.

Non-transitory computer-readable storage medium 1210 may comprise any of various appropriate types of memory devices or storage devices. Non-transitory computer-readable storage medium 1210 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash memory, magnetic media, e.g., a hard drive, or optical storage; registers, or other similar types of memory elements, etc. Non-transitory computer-readable storage medium 1210 may include other types of non-transitory memory as well, or combinations thereof. Accordingly, non-transitory computer-readable storage medium 1210 may include two or more memory media, which may reside in different locations—for example, in different computer systems that are connected over a network.

Design information 1215 may be specified using any of various appropriate computer languages, including hardware description languages such as, without limitation: VHDL, Verilog, SystemC, System Verilog, RHDL, M, MyHDL, etc. The format of various design information may be recognized by one or more applications executed by computing system 1240, semiconductor fabrication system 1220, or both. In some embodiments, design information 1215 may also include one or more cell libraries that specify the synthesis, layout, or both of integrated circuit 1230. In some embodiments, design information 1215 is specified in whole, or in part, in the form of a netlist that specifies cell library elements and their connectivity. Design information discussed herein, taken alone, may or may not include sufficient information for fabrication of a corresponding integrated circuit. For example, design information may specify the circuit elements to be fabricated but not their physical layout. In this case, design information may be combined with layout information to actually fabricate the specified circuitry.

Integrated circuit 1230 may, in various embodiments, include one or more custom macrocells, such as memories, analog or mixed-signal circuits, and the like. In such cases, design information 1215 may include information related to included macrocells. Such information may include, without limitation, schematics capture database, mask design data, behavioral models, and device or transistor level netlists. Mask design data may be formatted according to graphic data system (GDSII), or any other suitable format.

Semiconductor fabrication system 1220 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1220 may also be configured to perform various testing of fabricated circuits for correct operation.

In various embodiments, integrated circuit 1230 and computer simulation model of hardware circuit 1260 are configured to operate according to a circuit design specified by design information 1215, which may include performing any of the functionality described herein. For example, integrated circuit 1230 may include any of various elements shown in FIGS. 1-9. Further, integrated circuit 1230 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components. Similarly, stating "instructions of a hardware description programming language" that are "executable" to program a computing system to generate a computer simulation model does not imply that the instructions must be executed in order for the element to be met, but rather, specifies characteristics of the instructions. Additional features relating to the model (or the circuit represented by the model) may similarly relate to characteristics of the instructions, in this context. Therefore, an entity that sells a computer-readable medium with instructions that satisfy recited characteristics may provide an infringing product, even if another entity actually executes the instructions on the medium.

Note that a given design, at least in the digital logic context, may be implemented using a multitude of different gate arrangements, circuit technologies, etc. As one example, different designs may select or connect gates based on design tradeoffs (e.g., to focus on power consumption, performance, circuit area, etc.). Further, different manufacturers may have proprietary libraries, gate designs, physical gate implementations, etc. Different entities may also use different tools to process design information at various layers (e.g., from behavioral specifications to physical layout of gates).

Once a digital logic design is specified, however, those skilled in the art need not perform substantial experimentation or research to determine those implementations. Rather, those of skill in the art understand procedures to reliably and predictably produce one or more circuit implementations that provide the function described by design information 1215. The different circuit implementations may affect the performance, area, power consumption, etc. of a given design (potentially with tradeoffs between different design goals), but the logical function does not vary among the different circuit implementations of the same circuit design.

In some embodiments, the instructions included in design information 1215 provide RTL information (or other higher-level design information) and are executable by the computing system to synthesize a gate-level netlist that represents the hardware circuit based on the RTL information as an input. Similarly, the instructions may provide behavioral information and be executable by the computing system to synthesize a netlist or other lower-level design information included in low-level design information 1250. Low-level design information 1250 may program semiconductor fabrication system 1220 to fabricate integrated circuit 1230.

The present disclosure includes references to an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more of the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . W, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third," when applied to a feature, do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors, or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, a circuit, or a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), a functional unit, a memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement of such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as a structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits, or portions thereof, may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:

1. An apparatus, comprising:

a phase generation circuit configured to:

receive an input clock signal with a first frequency; and generate a plurality of phase signals using the input clock signal;

wherein the phase generator circuit includes:

a frequency divider circuit configured to generate a different clock signal with a third frequency, wherein a second ratio of the first frequency to the third frequency is an integer value; and a delay-locked loop circuit configured to generate the plurality of phase signals using the different clock signal; and a phase selection circuit configured to;

combine pairs of the plurality of phase signals to generate corresponding ones of a plurality of local clock signals;

generate a plurality of selection signals using the plurality of local clock signals; and select, using the plurality of selection signals, different phase signals of the plurality of phase signals at corresponding times to generate an output clock signal with a second frequency, wherein a ratio of the first frequency to the second frequency is a non-integer value.

2. The apparatus of claim 1, wherein to combine the pairs of the plurality of phase signals, the phase selection circuit is further configured to perform an exclusive-OR operation on a first phase signal of the plurality of phase signals and a second phase signal of the plurality of phase signals to generate a particular local clock signal of the plurality of local clock signals.

3. The apparatus of claim 1, wherein the phase selection circuit includes a plurality of flip-flop circuits coupled together along with an inverter circuit to form a daisy chain, wherein the plurality of flip-flop circuits includes a given flip-flop circuit that includes a primary-stage circuit and a secondary-stage circuit, wherein the given flip-flop circuit is configured to transfer data from the primary-stage circuit to the secondary-stage circuit using a corresponding one of the local clock signals, and wherein to generate the plurality of selection signals, the phase selection circuit is further configured to combine a first latched signal from a particular flip-flop circuit of the plurality of flip-flop circuits and a second latched signal from a different flip-flop circuit of the plurality of flip-flop circuits, wherein the different flip-flop circuit is subsequent to the particular flip-flop circuit in the daisy chain.

4. The apparatus of claim 1, wherein the frequency divider circuit includes a plurality of flip-flop circuits that include a particular flip-flop circuit whose clock input is could to a complement output of a different flip-flop circuit of the plurality of flip-flop circuits.

5. A method, comprising:

receiving, by a phase generation circuit, an input clock signal with a first frequency;

generating, by the phase generation circuit, a plurality of phase signals using the input clock signal, wherein the plurality of phase signals are delayed from the input clock signal by corresponding delay times;

combining, by a phase selection circuit, pairs of the plurality of phase signals to generate corresponding ones of a plurality of local clock signals;

generating, by the phase selection circuit, a plurality of selection signals using the plurality of local clock signals; and selecting, by the phase selection circuit using the plurality of local clock signals, different phase signals of the plurality of phase signals at corresponding times to generate an output clock signal with a second frequency, wherein a first ratio of the first frequency to the second frequency is a non-integer value; and wherein generating the plurality of phase signals includes:

generating, by a frequency divider circuit using the input clock signal, a different clock signal with a third frequency, wherein a second ratio of the first frequency to the third frequency is an integer value; and delaying, by a delay-locked loop circuit, the different clock signal by different delay values to generate corresponding ones of the plurality of phase signals.

6. The method of claim 5, wherein combining the pairs of the plurality of phase signals includes performing an exclusive-OR operation on a first phase signal of the plurality of phase signals and a second phase signal of the plurality of phase signals to generate a particular local clock signal of the plurality of local clock signals.

7. The method of claim 5, wherein generating the plurality of selection signals includes combining a first latched signal from a particular flip-flop circuit of a plurality of flip-flop circuits and a second latched signal from a different flip-flop circuit of the plurality of flip-flop circuits, wherein the plurality of flip-flop circuits are coupled together along with an inverter circuit to form a daisy chain, wherein the plurality of flip-flop circuits includes a given flip-flop circuit that includes a primary-stage circuit and a secondary-stage circuit, wherein the given flip-flop circuit is configured to transfer data from the primary-stage circuit to the secondary-stage circuit using a corresponding one of the local clock signals, and wherein the different flip-flop circuit is subsequent to the particular flip-flop circuit in the daisy chain.

8. The method of claim 5, further comprising generating, by a frequency-divider circuit, a reduced-frequency output clock signal using the output clock signal, wherein the third frequency of the reduced-frequency output clock signal is less than the first frequency.

9. The method of claim 5, wherein generating, by the frequency divider circuit using the input clock signal, the different clock signal includes:

clocking a first flip-flop circuit of a plurality of flip-flop circuits using the input clock signal; and clocking a second flip-flop circuit of the plurality of flip-flop circuits using a signal generated by the first flip-flop circuit.

10. An apparatus, comprising:

a first device coupled to a communication bus; and a second device coupled to the communication bus, wherein the second device includes a transceiver circuit that includes a fractional frequency-divider circuit configured to:

receive an input clock signal with a first frequency;

generate a plurality of phase signals using the input clock signal, wherein the plurality of phase signals are delayed from the input clock signal by corresponding delay times;

combine pairs of the plurality of phase signals to generate corresponding ones of a plurality of local clock signals;

generate a plurality of selection signals using the plurality of local clock signals; and select, using the plurality of local clock signal, different phase signals of the plurality of phase signals at corresponding times to generate an output clock signal with a second frequency, wherein a first ratio of the first frequency to the second frequency is a non-integer value; and wherein the transceiver circuit is configured to transmit data to the first device using the output clock signal; and wherein the fractional frequency-divider circuit includes a delay-locked loop circuit, and wherein to generate the plurality of phase signals, the fractional frequency-divider circuit is further configured to:

generate, using the input clock signal, a different clock signal with a third frequency, wherein a second ratio of the first frequency to the third frequency is an integer value; and delay, using the delay-locked loop circuit, the different clock signal by different delay values to generate corresponding ones of the plurality of phase signals.

11. The apparatus of claim 10, wherein to combine the pairs of the plurality of phase signals, the fractional frequency-divider circuit is configured to perform an exclusive-OR operation on a first phase signal of the plurality of phase signals and a second phase signal of the plurality of phase signals to generate a particular local clock signal of the plurality of local clock signals.

12. The apparatus of claim 10, wherein the fractional frequency-divider circuit includes a plurality of flip-flop circuits coupled together along with an inverter circuit to form a daisy chain, wherein the plurality of flip-flop circuits includes a given flip-flop circuit that includes a primary-stage circuit and a secondary-stage circuit, wherein the given flip-flop circuit is configured to transfer data from the primary-stage circuit to the secondary-stage circuit using a corresponding one of the local clock signals, wherein to generate the plurality of selection signals, the fractional frequency-divider circuit is further configured to combine a first latched signal from a particular flip-flop circuit of the plurality of flip-flop circuits and a second latched signal from a different flip-flop circuit of the plurality of flip-flop circuits, and wherein the different flip-flop circuit is subsequent to the particular flip-flop circuit in the daisy chain.

13. The apparatus of claim 10, wherein the fractional frequency-divider circuit is further configured to generate a reduced-frequency output clock signal using the output clock signal, wherein the third frequency of the reduced-frequency output clock signal is less than the first frequency.

14. The apparatus of claim 10, wherein the fractional frequency-divider circuit includes a plurality of flip-flop circuits and wherein to generate the different clock signal the fractional frequency-divider circuit is configured to:

generate, using a first flip-flop circuit of the plurality of flip-flop circuits, a first clock signal; and generate, using a second flip-flop circuit of the plurality of flip-flop circuits and the first clock signal, a second clock signal.

* * * * *